(12) United States Patent
Morris et al.

(10) Patent No.: US 11,201,449 B2
(45) Date of Patent: Dec. 14, 2021

(54) SYSTEMS FOR EFFICIENT CYCLICAL FIBER-OPTIC CONNECTIONS

(71) Applicant: HEWLETT PACKARD ENTERPRISE DEVELOPMENT LP, Houston, TX (US)

(72) Inventors: Terrel Morris, Garland, TX (US); Di Liang, Santa Barbara, CA (US); Raymond G. Beausoleil, Palo Alto, CA (US); Ashkan Seyedi, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 109 days.

(21) Appl. No.: 16/527,352

(22) Filed: Jul. 31, 2019

(65) Prior Publication Data
US 2021/0036481 A1 Feb. 4, 2021

(51) Int. Cl.
*H01S 3/00* (2006.01)
*H01S 5/00* (2006.01)
(Continued)

(52) U.S. Cl.
CPC .......... *H01S 3/0078* (2013.01); *H01S 3/0071* (2013.01); *H01S 5/0071* (2013.01);
(Continued)

(58) Field of Classification Search
CPC .... H01S 5/0078; H01S 5/0071; H01S 3/0078; H01S 3/0071; H04B 10/506; H04B 10/572
See application file for complete search history.

(56) References Cited

U.S. PATENT DOCUMENTS 3,622,909 A 11/1971 Woodcock et al.
6,680,962 B2 1/2004 Liu et al.
(Continued)

FOREIGN PATENT DOCUMENTS

CN 103678258 * 3/2014

OTHER PUBLICATIONS

RP Photonics Consulting GMBH, "Q Switching," printed from webpage on Mar. 14, 2019, https://www.rp-photonics.com/q_switching.html.

*Primary Examiner* — Michael Carter
(74) *Attorney, Agent, or Firm* — Hewlett Packard Enterprise Patent Department

(57) ABSTRACT

Processes and apparatuses described herein provide for an efficient cyclical fiber-optic connection between a source component and multiple destination components in a computing environment. A comb laser generates a laser signal that includes laser light of a first frequency that is red-shifted from a carrier frequency. The comb laser concurrently transmits the laser signal to four ring resonators via an optical waveguide. Three of the ring resonators are initially configured for optical resonance at a second frequency that is blue-shifted from the carrier frequency, while one of the ring resonators is initially configured for optical resonance at the first frequency. The laser signal is modulated to communicate data to a first target location associated with the ring resonator that is initially configured for optical resonance at the first frequency.

6 Claims, 6 Drawing Sheets

(51) Int. Cl.
*H04B 10/50* (2013.01)
*H04B 10/572* (2013.01)

(52) U.S. Cl.
CPC ......... *H01S 5/0078* (2013.01); *H04B 10/506* (2013.01); *H04B 10/572* (2013.01)

(56) References Cited

U.S. PATENT DOCUMENTS

| | | |
|---|---|---|
| 6,940,878 B2 | 9/2005 | Orenstein et al. |
| 7,411,989 B2 | 8/2008 | Spinelli et al. |
| 7,701,983 B2 | 4/2010 | Suzuki et al. |

\* cited by examiner

SYSTEMS FOR EFFICIENT CYCLICAL FIBER-OPTIC CONNECTIONS

BACKGROUND

The term "laser" is an acronym for light amplification by stimulated emission of radiation. Laser light may be generated when the electrons of atoms in certain materials (e.g., crystals, gases, or glasses) absorb energy from an energy source (e.g., an electrical current or another laser). As a result of this energy absorption, the electrons move from a ground state into an excited state. When the electrons return to the ground state, the electrons emit photons of relatively discrete wavelengths.

In fiber optics, laser light can be used as a medium for signal transmission. Fiber optic cables provide high bandwidth, low power loss, resistance to electromagnetic interference, and other qualities that are useful for a wide variety of applications.

BRIEF DESCRIPTION OF THE DRAWINGS

Various features and advantages of the invention will become apparent from the following description of examples of the invention, given by way of example only, which is made with reference to the accompanying drawings, of which.

DETAILED DESCRIPTION

In fiber optics, laser light can be used as a medium for signal transmission. Fiber optic cables provide high bandwidth, low power loss, resistance to electromagnetic interference, and other qualities that are useful for a wide variety of applications. Fiber optic cables can be used to transmit laser-light signals between different components in computing systems. For example, in high-performance computing (HPC) systems, components such as processors, caches, memory, and data stores communicate with each other to accomplish computational tasks. Frequently, HPC systems are applied to problems that are impractical for standard consumer computers (e.g., desktops and laptops) due to computational complexity, large data sets (e.g., "big data"), hardware limitations, time constraints, and other factors. Compared to other approaches for signal transmission, laser-light signals provide advantages such as increased bandwidth, reduced power consumption, and reduced latency.

In some contexts, it is useful for a source component to be able to send communications to multiple destination components in rapid succession in a cyclical fashion. However, existing approaches for communicating with multiple destinations in rapid succession face several challenges. Specifically, there is a lag time that results from overhead processes each time bandwidth is reallocated from one destination to another. When bandwidth is being reallocated frequently between multiple destinations, the lag times from each reallocation may add up to result in noticeable latency. Fiber optic communication is one context in which frequent bandwidth reallocation can be challenging—particularly in HPC systems where speed is highly valued.

Systems and methods described herein provide an approach whereby a cyclical fiber optic connection between a source component and multiple destination components can operate more efficiently. Specifically, the systems and methods described herein by reduce the amount of time it takes to reallocate bandwidth between the destination components. The systems and methods described herein also allow the source component to communicate with the destination components via a single waveguide. The systems and methods described herein leverage the configurability of comb lasers, the configurability of optical ring resonators, and various properties of laser light to achieve these and other advantages.

Figure 1:
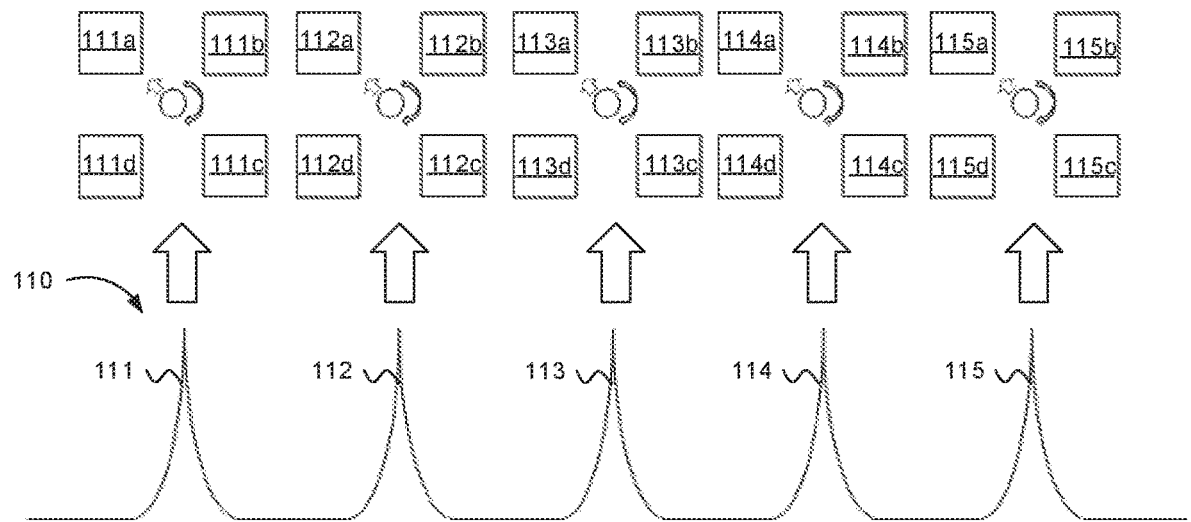
FIG. 1 is a conceptual diagram that illustrates how laser-light communications sent via a comb laser can be cyclically routed to multiple destinations, according to one example.

FIG. 1 is a conceptual diagram that illustrates how laser-light communications sent via a comb laser can be cyclically routed to multiple destinations, according to one example. As shown, the optical frequency comb 110 includes the carrier frequencies 111-115. Note that, in other examples, more or fewer carrier frequencies may be used. The optical frequency comb 110 can be produced via a comb laser. (Comb lasers are described in U.S. application Ser. No. 15/953,765, entitled "Comb Laser Arrays for DWDM Interconnects" by Ashkan Seyedi, Marco Fiorentino, Geza Kurczveil, and Raymond G. Beausoleil. The disclosure of U.S. application Ser. No. 15/953,765 is incorporated herein by reference.)

Each of the carrier frequencies 111-115 can be used to communicate information (e.g., as bits via amplitude modulation). Thus, in this example, five different streams of information—one for each carrier frequency—can be sent concurrently (e.g., simultaneously) via the frequency comb 110.

Each of the carrier frequencies 111-115 can be used to send information to up to four different destinations in a repeating sequential fashion. For example, carrier frequency 111 can be used to transmit information to destination 111*a*, then to destination 111*b*, then to destination 111*c*, then to destination 111*d*, and then back to destination 111*a* (and so forth in sequence) in rapid succession. Similarly, carrier frequency 112 can be used to transmit information to destination 112*a*, then to destination 112*b*, then to destination 112*c*, then to destination 112*d*, and then back to destination 112*a* (and so forth). Carrier frequency 113 can be used to transmit information in a similar cyclical manner to destinations 113*a-d*, carrier frequency 114 can be used to transmit information to destinations 114*a-d*, and carrier frequency 115*a-d* can be used to transmit information to destinations 115*a-d*.

A comb laser can be configured (e.g., tuned) to increase or decrease the carrier frequencies 111-115 in the optical frequency comb 110 together. In addition, optical ring resonators associated with the destinations 111*a-d*, 112*a-d*, 113*a-d*, 114*a-d*, 115*a-d* can be configured (e.g., tuned) for optical resonance at increased or decreased versions of the carrier frequencies 111-115. As described in greater details below, the comb laser and the ring resonators can be cyclically tuned to achieve a cyclical connection that provides advantages described herein.

Figure 2:
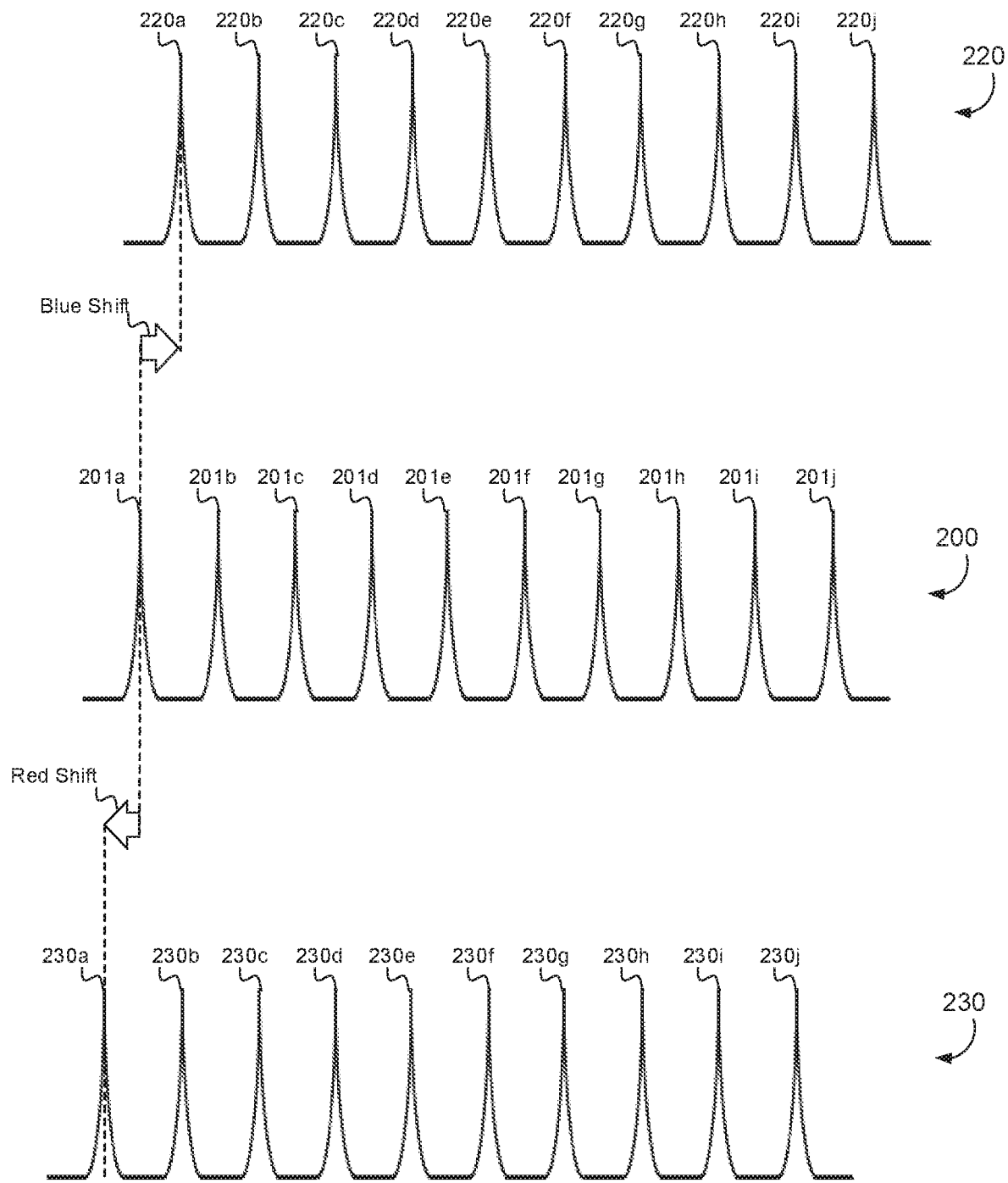
FIG. 2 illustrates transformations that occur when carrier frequencies in an optical frequency comb are red-shifted or blue-shifted, according to one example.

FIG. 2 illustrates transformations that occur when carrier frequencies in an optical frequency comb 200 are red-shifted or blue-shifted, according to one example. As shown, optical frequency comb 200 includes carrier frequencies 201a-j. A comb laser (not shown) that produces the optical frequency comb 200 can be configured (e.g., tuned) via an electrical current and/or the metal-oxide semiconductor (MOS) effect (e.g., achieved via a MOS capacitor) to increase or decrease the carrier frequencies 201a-j. (Tuning techniques for comb lasers are discussed in greater detail in U.S. application Ser. No. 15/745,709, entitled "Ring-Resonator Modulation of an Optical Signal" by Janet Chen, Cheng Li, Marco Fiorentino, and Raymond G. Beausoleil. The disclosure of U.S. application Ser. No. 15/745,709 is incorporated herein by reference.)

When the carrier frequencies 201a-j of the optical frequency comb 200 are blue shifted, the blue-shifted optical frequency comb 220 results. Specifically, the blue-shifted frequencies 220a-j result when the carrier frequencies 201a-j are blue shifted. Thus, the blue-shifted frequency 220a is slightly higher than the carrier frequency 201a. However, the blue-shifted frequency 220a is lower than the carrier frequency 201b. Similarly, the blue-shifted frequency 220b is slightly higher than the carrier frequency 201b, but is lower than the carrier frequency 220c. In one example, the blue shift can be accomplished by turning on the MOS effect and setting an electrical current to "low" at the comb laser.

By contrast, when the carrier frequencies 201a-j of the optical frequency comb 200 are red shifted, the red-shifted optical frequency comb 230 results. Specifically, the red shifted frequencies 230a-j result when the carrier frequencies 201a-j are red shifted. Thus, the red-shifted frequency 230a is slightly lower than the carrier frequency 201a. Similarly, the red-shifted frequency 230b is slightly lower than the carrier frequency 201b, but is higher than the carrier frequency 220a. In one example, the red shift can be accomplished by turning on the MOS effect off and setting an electrical current to "high" (e.g., higher than the level of the current used for the blue shift) at the comb laser.

The difference between the red-shifted optical frequency comb 230 and the blue-shifted optical frequency comb 220 is large enough that ring resonators that are configured for optical resonance at the red-shifted frequencies 230a-j will filter out the blue-shifted frequencies 220a-j. Similarly, ring resonators that are configured for optical resonance at the blue-shifted frequencies 220a-j will filter out the red-shifted frequencies 230a-j.

For example, if light of the red-shifted frequency 230b enters a ring resonator that is configured for optical resonance at blue-shifted frequency 220b, the light of the red-shifted frequency 230b will be negated (e.g., via destructive interference that occurs when the light passes through the ring resonator). Similarly, if light of the blue-shifted frequency 220b enters a ring resonator that is configured for optical resonance at the red-shifted frequency 230b, the light of the blue-shifted frequency 220b will be negated.

In another example, suppose light of the red-shifted frequency 230b is transmitted via a single waveguide to (1) three ring resonators that are configured for optical resonance at the blue-shifted frequency 220b and (2) one ring resonator that is configured for optical resonance at the red-shifted frequency 230b. In this example, the resonator that is configured for optical resonance at the red-shifted frequency 230b will propagate the light (e.g., to a second waveguide toward a destination component). By contrast, the three ring resonators that are configured for optical resonance at the blue-shifted frequency 220b will filter out the light. Thus, even though the light is being transmitted to four ring resonators, the light will be propagated to a single destination.

In one example, the carrier frequencies 201a-j are evenly spaced (i.e., frequency equidistant). In this example, suppose the frequency 201a is x terahertz (THZ), where x is a non-negative real-valued number. Also suppose the frequency 201b is (x+y) THZ, where y is also a non-negative real-valued number, that frequency 201c is ((x+y)+y) THZ, and so forth, such that the distance between any two adjacent frequencies included in the optical frequency comb 200 are spaced y THZ apart from each other. In addition, let $\partial$ be non-negative real-valued number that is less than 0.5 (e.g., 0.33). In this example, a frequency that is blue-shifted from a carrier frequency found in the optical frequency comb 200 can be defined as a frequency that equals the value of carrier frequency plus the product of y and $\partial$ (i.e., y multiplied by $\partial$) THZ. Conversely, a frequency that is red-shifted from a carrier frequency found in the optical frequency comb 200 can be defined as a frequency that equals the value of the carrier frequency minus the product of y and $\partial$ (i.e., y multiplied by $\partial$) THZ.

Figure 3:
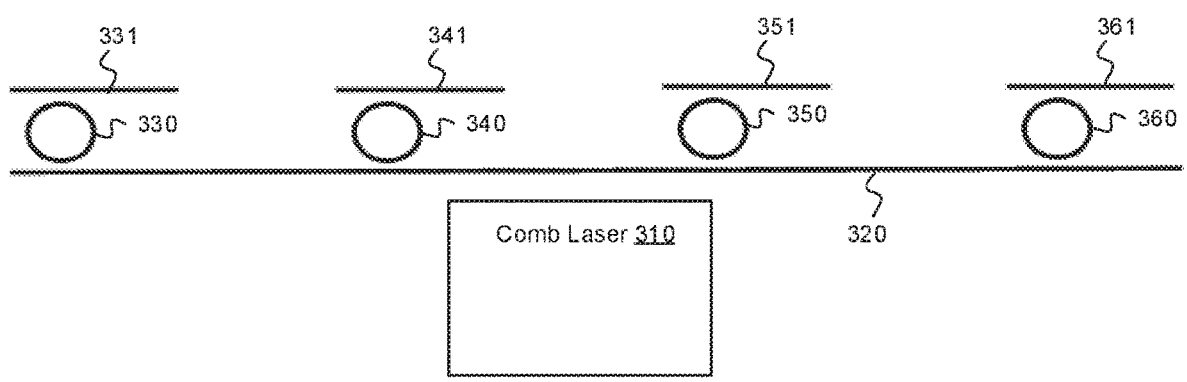
FIG. 3 is a diagram that illustrates how laser light of a single carrier frequency that is transmitted to four ring resonators via a single optical waveguide can be routed to four different destinations associated with those ring resonators, according to one example.

FIG. 3 is a diagram that illustrates how laser light of a single carrier frequency that is transmitted to four ring resonators via a single optical waveguide can be routed to four different destinations associated with those ring resonators, according to one example.

As shown, a comb laser 310 can generate a laser signal that includes laser light of a carrier frequency. The comb laser 310 can concurrently transmit the laser signal via the optical waveguide 320 to the ring resonator 330, the ring resonator 340, the ring resonator 350, and the ring resonator 360. The optical waveguide 320 may be a fiber optic cable or some other type of waveguide suitable for transmitting the laser signal from a source to a destination.

To illustrate one example of how a cyclical connection can operate, consider the following example. Initially, suppose the ring resonator 330 is configured (e.g., tuned) for optical resonance at a first frequency that is red-shifted from the carrier frequency. Also suppose the ring resonator 340, the ring resonator 350, and the ring resonator 360 are configured for optical resonance at a second frequency that is blue-shifted from the carrier frequency. If the light of the first frequency that is included in the laser signal is modulated (e.g., via amplitude modulation or frequency modulation) to communicate data, the ring resonator 330 will allow the light of the first frequency to continue through to the optical waveguide 331 and on to a first target location for which the ring resonator 330 acts as a gatekeeper. The data modulated onto the first frequency of the laser signal is thus transmitted to a destination component at that first target location. The destination component may be a cache, an area of memory, or some other type of destination in a computing system.

By contrast, the ring resonator 340, the ring resonator 350, and the ring resonator 360 will filter out (e.g., negate) the light of the first frequency that arrives via the optical waveguide 320. For this reason, the light of the first frequency will not enter the optical waveguide 341, the optical waveguide 351, or the optical waveguide 361. As a result, the data modulated onto the first frequency included in the laser signal will not be transmitted to target locations for which the ring resonator 340, the ring resonator 350, and the ring resonator 360 act as gatekeepers.

Next, suppose there is data that is destined for a second target location for which the ring resonator 340 acts as a gatekeeper. While data is being communicated to the first target location via the first frequency, a tuning process to reconfigure the ring resonator 350 and the ring resonator 360 for optical resonance at the first frequency commences (e.g., using an electrical current and/or the MOS effect). While the ring resonator 350 and the ring resonator 360 are being reconfigured for optical resonance at the first frequency, a tuning process to reconfigure the comb laser 310 to blue-shift the carrier frequency to a second frequency instead of the first frequency commences. Thus, the reconfiguration of the comb laser 310 may occur in a time frame that partially (or fully) overlaps with a time frame in which the ring resonator 350 and the ring resonator 360 are being reconfigured for optical resonance at the first frequency. The partial overlap between the reconfiguration of the comb laser 310 and the reconfiguration of the ring resonator 350 and the ring resonator 360 is advantageous because it reduces the amount of time that elapses between the moment when the comb laser 310 stops communicating with the first target location and the moment when the comb laser 310 starts communicating with the second target location (as is demonstrated in further detail below).

Once the reconfiguration of the ring resonator 350 and the ring resonator 360 for optical resonance at the first frequency is completed, the reconfiguration of the comb laser 310 is also completed shortly thereafter. Once the reconfiguration of the comb laser 310 is complete, the laser signal generated by the comb laser 310 includes laser light of the second frequency (which is blue-shifted from the carrier frequency) instead of the first frequency.

The comb laser 310 continues transmitting the laser signal via the optical waveguide 320 to the ring resonator 330, the ring resonator 340, the ring resonator 350, and the ring resonator 360 concurrently. Since the ring resonator 330 is still configured for optical resonance at the first frequency, the second frequency of the laser signal will be filtered out by the ring resonator 330. Similarly, since the ring resonator 350 and the ring resonator 360 have been reconfigured for optical resonance at the first frequency, the second frequency of the laser signal will be filtered out by the ring resonator 350 and the ring resonator 360.

However, since the ring resonator 340 is still configured for optical resonance at the second frequency, data that is destined for the second target location can be modulated onto the second frequency of the laser signal. The ring resonator 340 will allow the light of the second frequency to continue through to the optical waveguide 341 and on to the second target location. The data modulated onto the second frequency of the laser signal is thus transmitted to a destination component at the second target location. Again, the destination component may be a cache, an area of memory, or some other type of destination in a computing system.

Since the ring resonator 340 was already configured for optical resonance at the second frequency before the reconfiguration of the comb laser 310 to include the second frequency in the laser signal was completed, the comb laser 310 can send data to the second target location immediately without waiting for the ring resonator 340 to be reconfigured. Furthermore, since the ring resonator 330 is still configured for optical resonance at the first frequency, there is no need to wait for the ring resonator 330 to be reconfigured as the second frequency will be filtered out by the ring resonator 330. Thus, the time to switch between destinations for data communicated by a laser signal is reduced compared to approaches that involve waiting for a ring resonator associated with a previous destination or a current destination to be reconfigured.

Next, suppose there is data that is destined for a third target location for which the ring resonator 350 acts as a gatekeeper. While data is being communicated to the second target location via the second frequency, a tuning process to reconfigure the ring resonator 330 and the ring resonator 360 for optical resonance at the second frequency commences (e.g., using an electrical current and/or the MOS effect). While the ring resonator 330 and the ring resonator 360 are being reconfigured for optical resonance at the second frequency, a tuning process to reconfigure the comb laser 310 to red-shift the carrier frequency back to the first frequency instead of the second frequency commences. Again, the reconfiguration of the comb laser 310 may occur in a time frame that partially (or fully) overlaps with a time frame in which the ring resonator 330 and the ring resonator 360 are being reconfigured for optical resonance at the second frequency. The partial overlap between the reconfiguration of the comb laser 310 and the reconfiguration of the ring resonator 330 and the ring resonator 360 will reduce the amount of time that elapses between the moment when the comb laser 310 stops communicating with the second target location and the moment when the comb laser 310 starts communicating with the third target location.

Once the reconfiguration of the ring resonator 330 and the ring resonator 360 for optical resonance at the second frequency is completed, the concurrent reconfiguration of the comb laser 310 is also completed shortly thereafter. Once the concurrent reconfiguration of the comb laser 310 is complete, the laser signal generated by the comb laser 310 again includes laser light of the first frequency (which is red-shifted from the carrier frequency) instead of the second frequency.

The comb laser 310 continues transmitting the laser signal via the optical waveguide 320 to the ring resonator 330, the ring resonator 340, the ring resonator 350, and the ring resonator 360 concurrently. Since the ring resonator 340 is still configured for optical resonance at the second frequency, the first frequency of the laser signal will be filtered out by the ring resonator 340. Similarly, since the ring resonator 330 and the ring resonator 360 have been reconfigured for optical resonance at the second frequency, the first frequency of the laser signal will be filtered out by the ring resonator 330 and the ring resonator 360.

However, as noted above, the ring resonator 350 was already reconfigured for optical resonance at the first frequency before data began to be transferred to the second location. As a result, data that is destined for the third target location can now be modulated onto the first frequency of the laser signal immediately without waiting for the ring resonator 350 to be reconfigured. The ring resonator 350 will currently allow the light of the first frequency to continue through to the optical waveguide 351 and on to the third target location. The data currently modulated onto the first frequency of the laser signal is thus transmitted to a destination component at the third target location.

Next, suppose there is data that is destined for a fourth target location for which the ring resonator 360 acts as a gatekeeper. While data is being communicated to the third target location via the first frequency, a tuning process to reconfigure the ring resonator 330 and the ring resonator 340 for optical resonance at the first frequency commences (e.g., using an electrical current and/or the MOS effect). While the ring resonator 330 and the ring resonator 360 are being reconfigured for optical resonance at the first frequency, a tuning process to reconfigure the comb laser 310 to blue-shift the carrier frequency back to the second frequency instead of the first frequency commences. Again, the reconfiguration of the comb laser 310 may occur in a time frame that partially (or fully) overlaps with a time frame in which the ring resonator 330 and the ring resonator 340 are being reconfigured for optical resonance at the first frequency. Again, the partial overlap between the reconfiguration of the comb laser 310 and the reconfiguration of the ring resonator 330 and the ring resonator 340 will reduce the amount of time that elapses between the moment when the comb laser 310 stops communicating with the third target location and the moment when the comb laser 310 starts communicating with the fourth target location.

Once the reconfiguration of the ring resonator 330 and the ring resonator 340 for optical resonance at the first frequency is completed, the concurrent reconfiguration of the comb laser 310 is also completed shortly thereafter. Once the concurrent reconfiguration of the comb laser 310 is complete, the laser signal generated by the comb laser 310 again includes laser light of the second frequency (which is blue-shifted from the carrier frequency) instead of the first frequency.

The comb laser 310 continues transmitting the laser signal via the optical waveguide 320 to the ring resonator 330, the ring resonator 340, the ring resonator 350, and the ring resonator 360 concurrently. Since the ring resonator 350 is still configured for optical resonance at the first frequency, the second frequency of the laser signal will be filtered out by the ring resonator 350. Similarly, since the ring resonator 330 and the ring resonator 340 have been reconfigured for optical resonance at the first frequency, the second frequency of the laser signal will be filtered out by the ring resonator 330 and the ring resonator 340.

However, as noted above, the ring resonator 360 was already reconfigured for optical resonance at the second frequency before data began to be transferred to the third location. As a result, data that is destined for the fourth target location can now be modulated onto the second frequency of the laser signal immediately without waiting for the ring resonator 360 to be reconfigured. The ring resonator 360 will currently allow the light of the second frequency to continue through to the optical waveguide 361 and on to the fourth target location. The data currently modulated onto the second frequency of the laser signal is thus transmitted to a destination component at the fourth target location.

Next, suppose there is again data that is destined for the first target location. While data is being communicated to the fourth target location via the second frequency, a tuning process to reconfigure the ring resonator 340 and the ring resonator 350 for optical resonance at the second frequency commences. While the ring resonator 340 and the ring resonator 350 are being reconfigured for optical resonance at the second frequency, a tuning process to reconfigure the comb laser 310 to red-shift the carrier frequency back to the first frequency instead of the second frequency commences. Again, the reconfiguration of the comb laser 310 may occur in a time frame that partially overlaps with a time frame in which the ring resonator 340 and the ring resonator 350 are being reconfigured for optical resonance at the second frequency. Again, the partial overlap between the reconfiguration of the comb laser 310 and the reconfiguration of the ring resonator 340 and the ring resonator 350 will reduce the amount of time that elapses between the moment when the comb laser 310 stops communicating with the fourth target location and the moment when the comb laser 310 starts communicating with the first target location.

Once the reconfiguration of the ring resonator 340 and the ring resonator 350 for optical resonance at the second frequency is completed, the concurrent reconfiguration of the comb laser 310 is also completed shortly thereafter. Once the concurrent reconfiguration of the comb laser 310 is complete, the laser signal generated by the comb laser 310 again includes laser light of the first frequency (which is red-shifted from the carrier frequency) instead of the second frequency.

The comb laser 310 continues transmitting the laser signal via the optical waveguide 320 to the ring resonator 330, the ring resonator 340, the ring resonator 350, and the ring resonator 360 concurrently. Since the ring resonator 360 is still configured for optical resonance at the second frequency, the first frequency of the laser signal will be filtered out by the ring resonator 360. Similarly, since the ring resonator 340 and the ring resonator 350 have been reconfigured for optical resonance at the second frequency, the first frequency of the laser signal will be filtered out by the ring resonator 340 and the ring resonator 350.

However, as noted above, the ring resonator 330 was already reconfigured for optical resonance at the first frequency before data began to be transferred to the fourth location. As a result, data that is destined for the first target location can now be modulated onto the first frequency of the laser signal immediately without waiting for the ring resonator 330 to be reconfigured. The ring resonator 330 will currently allow the light of the first frequency to continue through to the optical waveguide 331 and on to the first target location. The data currently modulated onto the first frequency of the laser signal is thus transmitted to the destination component at the first target location.

To simplify the explanation, the example provided above with respect to FIG. 3 discusses how a cyclical connection can operate using a single carrier frequency that oscillates between being red-shifted and blue-shifted. However, a similar cyclical connection can exist concurrently for each optical frequency that is included in the laser signal generated by a comb laser. In general, the entire comb (i.e., the set of carrier frequencies generated by the comb laser) is red-shifted or blue-shifted together. As a result, when multiple cyclical connections are operating concurrently via a single comb laser, the frequencies used for those cyclical connections will typically be red-shifted and blue-shifted simultaneously.

Figure 4:
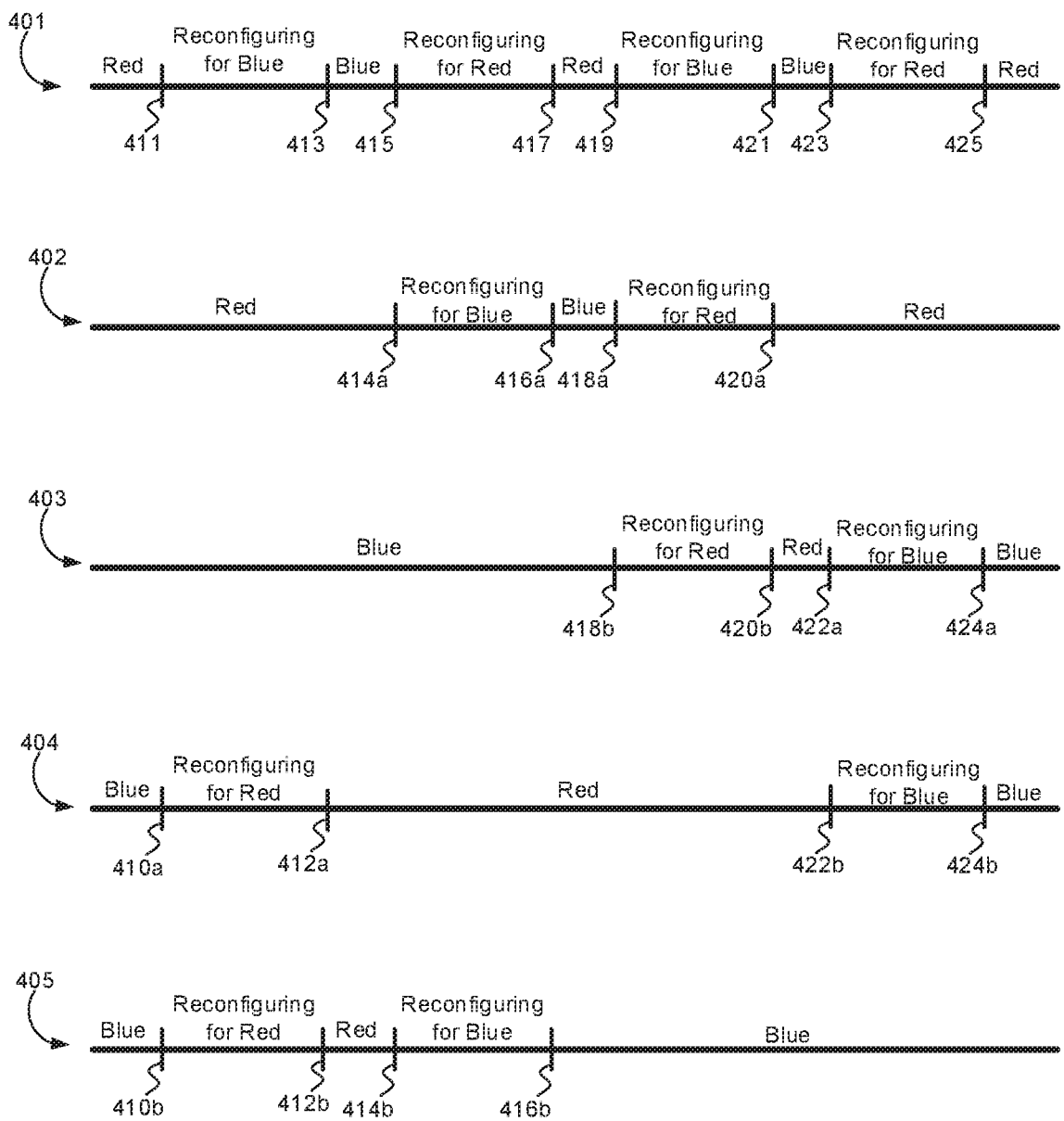
FIG. 4 illustrates a set of timelines for a comb laser and four ring resonators that operate in accordance with a cyclical connection described herein, according to one example.

FIG. 4 illustrates a set of timelines for a comb laser and four ring resonators that operate in accordance with a cyclical connection described herein, according to one example. Timeline 401 illustrates a sequence of states for a comb laser that cycles between transmitting data to four destination components via a laser-light signal. In this example, timeline 401 proceeds from left to right.

Timeline 402 illustrates a sequence of states for a first ring resonator that is associated with a first destination component. Similarly, timeline 403, timeline 404, and timeline 405 illustrate sequences of states for a second destination component, a third destination component, and a third destination component, respectively.

As shown in timeline 401, the comb laser is initially configured to transmit a laser signal that includes a red-shifted frequency (i.e., a frequency that is red-shifted from a carrier frequency). As shown in timeline 402, the first ring resonator is initially configured (e.g., tuned) for optical resonance at the red-shifted frequency. As shown in timeline 403, timeline 404, and timeline 405, the first, second, and third ring resonators are initially configured for optical resonance at a blue-shifted frequency (i.e., a frequency that is blue shifted from the carrier frequency). Thus, the first ring resonator propagates the red-shifted frequency to the first destination component while the second, third, and fourth ring resonators do not.

At junctures 410a-b, reconfiguration of the third ring resonator and the fourth ring resonator for optical resonance at the red-shifted frequency commences. In the meantime, at juncture 411, reconfiguration of the comb laser to transmit the blue-shifted frequency commences.

At junctures 412a-b, reconfiguration of the third ring resonator and the fourth ring resonator for optical resonance at the red-shifted frequency is completed. At juncture 413, reconfiguration of the comb laser is completed such that the comb laser begins to transmit the blue-shifted frequency in the laser signal instead of the red-shifted frequency.

Note that the length of time that elapses between junctures 410a-b and juncture 411 may vary in different examples (or, in some cases, be zero). Similarly, the length of time that elapses between junctures 412a-b and juncture 413 may vary (or be zero) as long as the comb laser does not begin transmitting via the blue-shifted frequency before the reconfiguration of the third ring resonator and the fourth ring resonator for optical resonance at the red-shifted frequency is completed. In general, as the amount of overlap time between the reconfiguration of the comb laser and the reconfiguration of the third and fourth ring resonators increases, the amount of time saved in comparison with existing techniques for cyclical connections increases.

By the time the comb laser begins transmitting the blue-shifted frequency after juncture 413, the first ring resonator, the third ring resonator, and the fourth ring resonator are each configured for optical resonance at the red-shifted frequency. For this reason, the first ring resonator, the third ring resonator, and the fourth ring resonator do not propagate the blue-shifted frequency to the first destination component, the third destination component, and the fourth destination component, respectively. However, the second ring resonator is still configured for optical resonance at the blue-shifted frequency. As a result, the second ring resonator propagates the blue-shifted frequency to the second destination component.

At junctures 414a-b, reconfiguration of the first ring resonator and the fourth ring resonator for optical resonance at the blue-shifted frequency commences. In the meantime, at juncture 415, reconfiguration of the comb laser to transmit the red-shifted frequency commences.

At junctures 416a-b, reconfiguration of the first ring resonator and the fourth ring resonator for optical resonance at the blue-shifted frequency is completed. At juncture 417, reconfiguration of the comb laser is completed such that the comb laser begins to transmit the red-shifted frequency in the laser signal instead of the blue-shifted frequency.

Again, the length of time that elapses between junctures 414a-b and juncture 415 may vary. Similarly, the length of time that elapses between junctures 416a-b and juncture 417 may vary (or be zero) as long as the comb laser does not begin transmitting via the red-shifted frequency before the reconfiguration of the first ring resonator and the fourth ring resonator for optical resonance at the blue-shifted frequency is completed. Again, it is advantageous to increase the amount of overlap time between the reconfiguration of the comb laser and the reconfiguration of the first ring resonator and fourth ring resonator.

By the time the comb laser begins transmitting the red-shifted frequency after juncture 417, the first ring resonator, the second ring resonator, and the fourth ring resonator are each configured for optical resonance at the blue-shifted frequency. For this reason, the first ring resonator, the second ring resonator, and the fourth ring resonator do not propagate the red-shifted frequency to the first destination component, the second destination component, and the fourth destination component, respectively. However, as noted above, the third ring resonator was reconfigured for optical resonance at the red-shifted frequency between juncture 410a and juncture 412a. Therefore, the third ring resonator propagates the red-shifted frequency to the third destination component.

At junctures 418a-b, reconfiguration of the first ring resonator and the second ring resonator for optical resonance at the red-shifted frequency commences. In the meantime, at juncture 419, reconfiguration of the comb laser to transmit the blue-shifted frequency commences.

At junctures 420a-b, reconfiguration of the first ring resonator and the second ring resonator for optical resonance at the red-shifted frequency is completed. At juncture 421, reconfiguration of the comb laser is completed such that the comb laser begins to transmit the blue-shifted frequency in the laser signal instead of the red-shifted frequency.

Again, the length of time that elapses between junctures 418a-b and juncture 419 may vary. Similarly, the length of time that elapses between junctures 420a-b and juncture 421 may vary (or be zero) as long as the comb laser does not begin transmitting via the blue-shifted frequency before the reconfiguration of the first ring resonator and the second ring resonator for optical resonance at the red-shifted frequency is completed. Again, it is advantageous to increase the amount of overlap time between the reconfiguration of the comb laser and the reconfiguration of the first ring resonator and the second ring resonator.

When the comb laser begins transmitting the blue-shifted frequency after juncture 421, the first ring resonator, the second ring resonator, and the third ring resonator are each configured for optical resonance at the red-shifted frequency. For this reason, the first ring resonator, the second ring resonator, and the third ring resonator do not propagate the blue-shifted frequency to the first destination component, the second destination component, and the third destination component, respectively. However, as noted above, the fourth ring resonator was reconfigured for optical resonance at the blue-shifted frequency between juncture 414b and juncture 416b. Therefore, the fourth ring resonator propagates the blue-shifted frequency to the fourth destination component.

At junctures 422a-b, reconfiguration of the second ring resonator and the third ring resonator for optical resonance at the blue-shifted frequency commences. In the meantime, at juncture 423, reconfiguration of the comb laser to transmit the red-shifted frequency commences.

At junctures 424a-b, reconfiguration of the second ring resonator and the third ring resonator for optical resonance at the blue-shifted frequency is completed. At juncture 425, reconfiguration of the comb laser is completed such that the comb laser begins to transmit the red-shifted frequency in the laser signal instead of the blue-shifted frequency.

Again, the length of time that elapses between junctures 422a-b and juncture 423 may vary. Also, the length of time that elapses between junctures 424a-b and juncture 425 may vary as long as the comb laser does not begin transmitting via the red-shifted frequency before the reconfiguration of the second ring resonator and the third ring resonator for optical resonance at the blue-shifted frequency is completed. Again, it is advantageous to increase the amount of overlap time between the reconfiguration of the comb laser and the reconfiguration of the second ring resonator and the third ring resonator.

When the comb laser begins transmitting the red-shifted frequency after juncture 425, the second ring resonator, the third ring resonator, and the fourth ring resonator are each configured for optical resonance at the blue-shifted frequency. For this reason, the second ring resonator, the third ring resonator, and the fourth ring resonator do not propagate the red-shifted frequency to the second destination component, the third destination component, and the fourth destination component, respectively. However, as noted above, the first ring resonator was reconfigured for optical resonance at the red-shifted frequency between juncture 418a and juncture 420a. Therefore, the first ring resonator propagates the red-shifted frequency to the first destination component.

At this point, the comb laser, the first ring resonator, the second ring resonator, the third ring resonator, and the fourth ring resonator are each in the same states they were in at the commencement of the timelines 401-405, respectively. Therefore, the sequence of concurrent states shown by the timelines 401-405 can be cyclically repeated.

Figure 5:
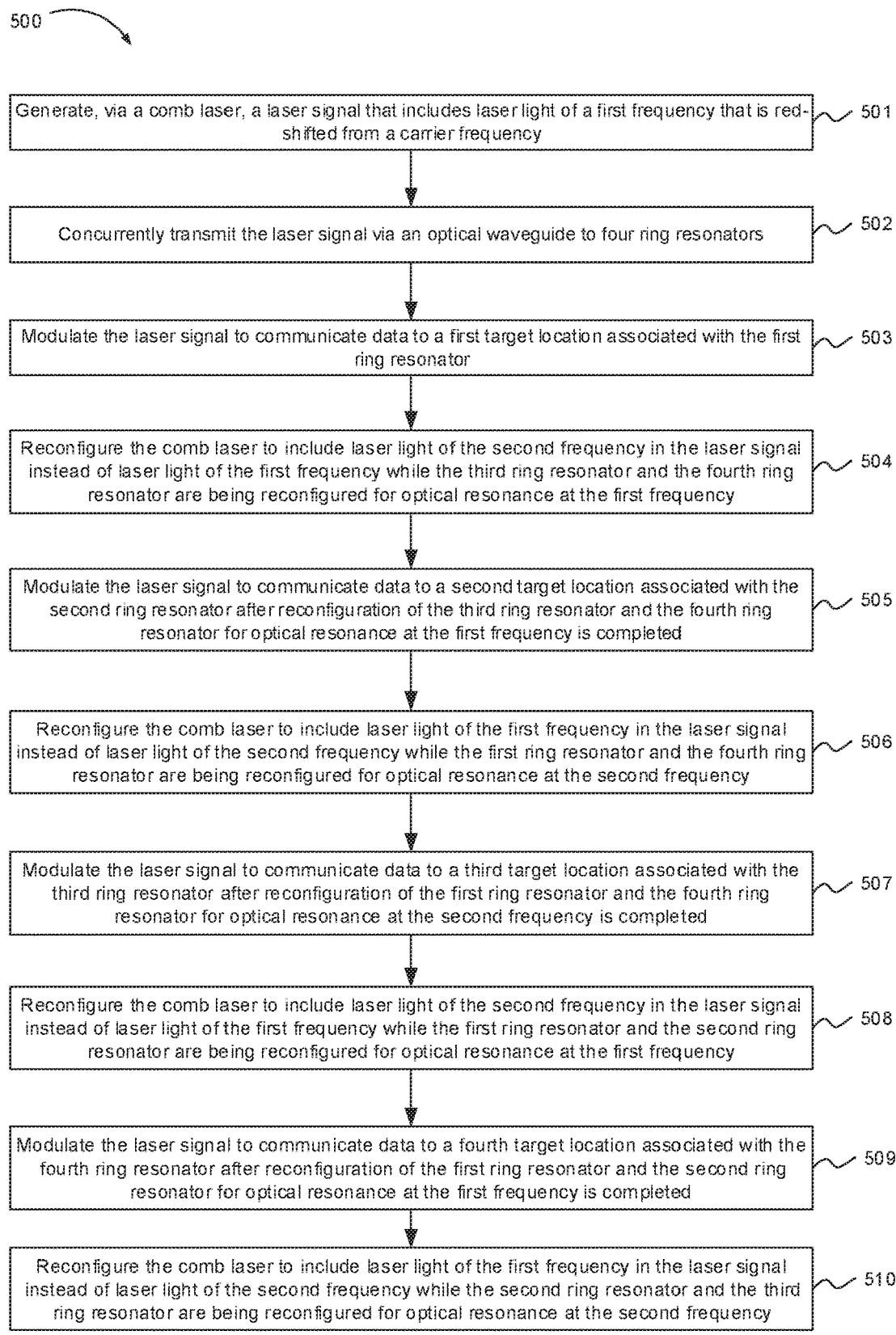
FIG. 5 illustrates functionality for comb laser as described herein, according to one example.

FIG. 5 illustrates functionality 500 for comb laser as described herein, according to one example. The functionality 500 may be implemented as a method or can be executed as instructions on a machine (e.g., by one or more processors), where the instructions are included on at least one computer-readable storage medium (e.g., a transitory or non-transitory computer-readable storage medium). While ten blocks are shown in the functionality 500, the functionality 500 may include other actions described herein. Also, in some examples, some blocks may be omitted without departing from the spirit and scope of this disclosure.

As shown in block 501, the functionality 500 includes generating, via a comb laser, a laser signal that includes laser light of a first frequency that is red-shifted from a carrier frequency.

As shown in block 502, the functionality 500 includes concurrently transmitting the laser signal via an optical waveguide to four ring resonators. With regard to those four ring resonators, a first ring resonator is initially configured for optical resonance at the first frequency, a second ring resonator is initially configured for optical resonance at a second frequency that is blue-shifted from the carrier frequency, a third ring resonator is initially configured for optical resonance at the second frequency, and a fourth ring resonator is initially configured for optical resonance at the second frequency.

As shown in block 503, the functionality 500 includes modulating the laser signal to communicate data to a first target location associated with the first ring resonator.

As shown in block 504, the functionality 500 includes reconfiguring the comb laser to include laser light of the second frequency in the laser signal instead of laser light of the first frequency while the third ring resonator and the fourth ring resonator are being reconfigured for optical resonance at the first frequency.

As shown in block 505, the functionality 500 includes modulating the laser signal to communicate data to a second target location associated with the second ring resonator after reconfiguration of the third ring resonator and the fourth ring resonator for optical resonance at the first frequency is completed.

As shown in block 506, the functionality 500 includes reconfiguring the comb laser to include laser light of the first frequency in the laser signal instead of laser light of the second frequency while the first ring resonator and the fourth ring resonator are being reconfigured for optical resonance at the second frequency.

As shown in block 507, the functionality 500 includes modulating the laser signal to communicate data to a third target location associated with the third ring resonator after reconfiguration of the first ring resonator and the fourth ring resonator for optical resonance at the second frequency is completed.

As shown in block 508, the functionality 500 includes reconfiguring the comb laser to include laser light of the second frequency in the laser signal instead of laser light of the first frequency while the first ring resonator and the second ring resonator are being reconfigured for optical resonance at the first frequency.

As shown in block 509, the functionality 500 includes modulating the laser signal to communicate data to a fourth target location associated with the fourth ring resonator after reconfiguration of the first ring resonator and the second ring resonator for optical resonance at the first frequency is completed.

As shown in block 510, the functionality 500 includes reconfiguring the comb laser to include laser light of the first frequency in the laser signal instead of laser light of the second frequency while the second ring resonator and the third ring resonator are being reconfigured for optical resonance at the second frequency.

Figure 6:
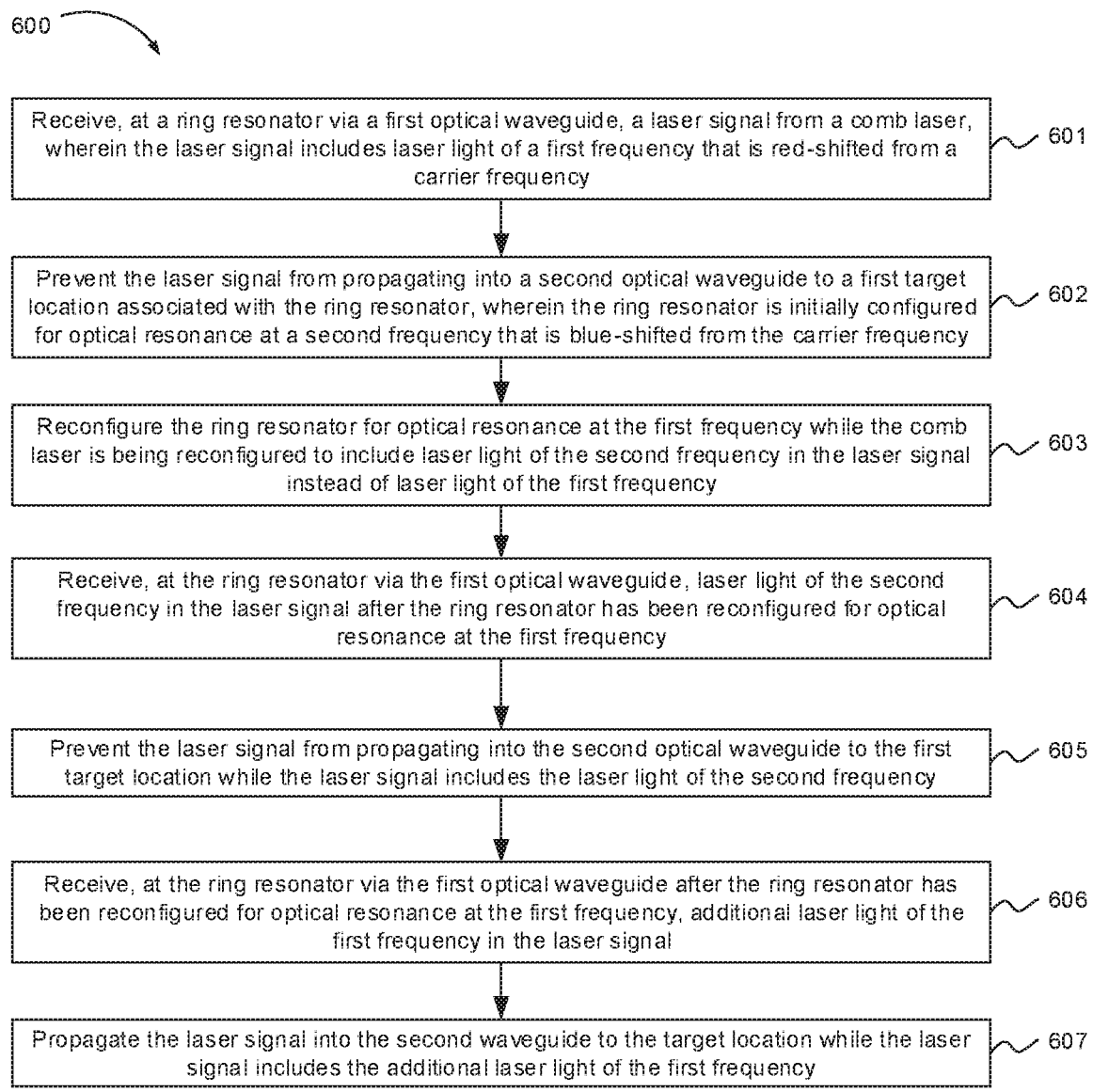
FIG. 6 illustrates functionality for ring resonator as described herein, according to one example.

FIG. 6 illustrates functionality 600 for ring resonator as described herein, according to one example. The functionality 600 may be implemented as a method or can be executed as instructions on a machine (e.g., by one or more processors), where the instructions are included on at least one computer-readable storage medium (e.g., a transitory or non-transitory computer-readable storage medium). While seven blocks are shown in the functionality 600, the functionality 600 may include other actions described herein. Furthermore, in some examples, some of the blocks shown may be omitted without departing from the spirit and scope of this disclosure.

As shown in block 601, the functionality 600 includes receiving, at a ring resonator via a first optical waveguide, a laser signal from a comb laser, wherein the laser signal includes laser light of a first frequency that is red-shifted from a carrier frequency.

As shown in block 602, the functionality 600 includes preventing the laser signal from propagating into a second optical waveguide to a first target location associated with the ring resonator, wherein the ring resonator is initially configured for optical resonance at a second frequency that is blue-shifted from the carrier frequency.

As shown in block 603, the functionality 600 includes reconfiguring the ring resonator for optical resonance at the first frequency while the comb laser is being reconfigured to include laser light of the second frequency in the laser signal instead of laser light of the first frequency.

As shown in block 604, the functionality 600 includes receiving, at the ring resonator via the first optical waveguide, laser light of the second frequency in the laser signal after the ring resonator has been reconfigured for optical resonance at the first frequency.

As shown in block 605, the functionality 600 includes preventing the laser signal from propagating into the second optical waveguide to the first target location while the laser signal includes the laser light of the second frequency.

As shown in block 606, the functionality 600 includes receiving, at the ring resonator via the first optical waveguide after the ring resonator has been reconfigured for optical resonance at the first frequency, additional laser light of the first frequency in the laser signal.

As shown in block 607, the functionality 600 includes propagating the laser signal into the second waveguide to the target location while the laser signal includes the additional laser light of the first frequency.

The functionality 600 may also include receiving, at the ring resonator via the first optical waveguide after the ring resonator has been reconfigured for optical resonance at the first frequency, additional laser light of the second frequency in the laser signal. Furthermore, the functionality 600 may include preventing the laser signal from propagating into the second optical waveguide to the first target location while the laser signal includes the additional laser light of the second frequency.

The functionality 600 may also include receiving, at an additional ring resonator via the first optical waveguide, the laser signal from the comb laser, wherein the laser signal includes laser light of a first additional frequency that is red-shifted from an additional carrier frequency concurrently with the laser light of a first frequency that is red-shifted from a carrier frequency. In addition, the functionality 600 may include preventing, via the additional ring resonator, the laser signal from propagating into the second optical waveguide to the first target location, wherein the additional ring resonator is initially configured for optical resonance at a second additional frequency that is blue-shifted from the additional carrier frequency.

The functionality 600 may also include reconfiguring the additional ring resonator for optical resonance at the first additional frequency while the comb laser is being reconfigured to include laser light of the second additional frequency in the laser signal instead of laser light of the first additional frequency. The functionality 600 may further include receiving, at the additional ring resonator via the first optical waveguide, laser light of the second additional frequency in the laser signal after the additional ring resonator has been reconfigured for optical resonance at the first additional frequency. Also, the functionality 600 may include preventing the laser signal from propagating into the second optical waveguide to the first target location while the laser signal includes the laser light of the second additional frequency.

The functionality 600 may also include receiving, at the additional ring resonator via the first optical waveguide after the additional ring resonator has been reconfigured for optical resonance at the first additional frequency, additional laser light of the first additional frequency in the laser signal. Also, the functionality 600 may include propagating the laser signal into the second waveguide to the target location while the laser signal includes the additional laser light of the first additional frequency.

EXAMPLES

The following additional examples are included below to highlight several aspects of the apparatus and processes described herein. However, the scope of the disclosure is not limited to these additional examples or the other examples described herein.

Example 1 includes a system comprising: one or more processors; a comb laser; an optical waveguide; a first ring resonator, a second ring resonator, a third ring resonator, and a fourth ring resonator; and a memory storing instructions that, when executed on the one or more processors, perform a set of actions comprising: generating, via the comb laser, a laser signal that includes laser light of a first frequency that is red-shifted from a carrier frequency, concurrently transmitting the laser signal via an optical waveguide to four ring resonators, wherein the first ring resonator is initially configured for optical resonance at the first frequency, the second ring resonator is initially configured for optical resonance at a second frequency that is blue-shifted from the carrier frequency, the third ring resonator is initially configured for optical resonance at the second frequency, and the fourth ring resonator is initially configured for optical resonance at the second frequency, modulating the laser signal to communicate data to a first target location associated with the first ring resonator, and concurrently reconfiguring the comb laser to include laser light of the second frequency in the laser signal instead of laser light of the first frequency while reconfiguring the third ring resonator and the fourth ring resonator for optical resonance at the first frequency.

Example 2 includes the system of example 1, wherein the set of actions further comprises: modulating the laser signal to communicate data to a second target location associated with the second ring resonator after reconfiguration of the third ring resonator and the fourth ring resonator for optical resonance at the first frequency is completed; and concurrently reconfiguring the comb laser to include laser light of the first frequency in the laser signal instead of laser light of the second frequency while reconfiguring the first ring resonator and the fourth ring resonator for optical resonance at the second frequency.

Example 3 includes the system of example 2, wherein the set of actions further comprises: modulating the laser signal to communicate data to a third target location associated with the third ring resonator after reconfiguration of the first ring resonator and the fourth ring resonator for optical resonance at the second frequency is completed; and concurrently reconfiguring the comb laser to include laser light of the second frequency in the laser signal instead of laser light of the first frequency while reconfiguring the first ring resonator and the second ring resonator for optical resonance at the first frequency.

Example 4 includes the system of example 3, wherein the set of actions further comprises: modulating the laser signal to communicate data to a fourth target location associated with the fourth ring resonator after reconfiguration of the first ring resonator and the second ring resonator for optical resonance at the first frequency is completed.

Example 5 includes the system of example 4, wherein the set of actions further comprises: concurrently reconfiguring the comb laser to include laser light of the first frequency in the laser signal instead of laser light of the second frequency while reconfiguring the second ring resonator and the third ring resonator for optical resonance at the second frequency.

Example 6 includes the system of example 1, 2, 3, 4, or 5, wherein the laser signal includes laser light of a first additional frequency that is red-shifted from an additional carrier frequency, and wherein the set of actions further comprises: concurrently transmitting the laser signal via the optical waveguide to an additional four ring resonators, wherein: a first additional ring resonator is initially configured for optical resonance at the first additional frequency, a second additional ring resonator is initially configured for optical resonance at a second additional frequency that is blue-shifted from the additional carrier frequency, a third additional ring resonator is initially configured for optical resonance at the second additional frequency, and a fourth additional ring resonator is initially configured for optical resonance at the second additional frequency; modulating the laser signal to communicate data to a first additional target location associated with the first additional ring resonator; and concurrently reconfiguring the comb laser to include laser light of the second additional frequency in the laser signal instead of laser light of the first additional frequency while reconfiguring the third additional ring resonator and the fourth additional ring resonator for optical resonance at the first additional frequency.

Example 7 includes the system of example 1, 2, 3, 4, 5, or 6, wherein the laser signal includes laser light of N frequencies, wherein N is an integer greater than one, and wherein the set of actions further comprises: concurrently transmitting the laser signal via the optical waveguide to a number of ring modulators equal to N multiplied by four; and modulating the laser signal to communicate data to N destinations associated with N ring modulators concurrently.

While the apparatuses and processes disclosed herein may be susceptible to various modifications and alternative forms, it is to be understood that the apparatuses and processes are not limited to the particular examples disclosed herein. The present apparatuses and processes include all alternatives, modifications, and equivalents falling within the true spirit and scope of the appended claims.

What is claimed is:

1. A method comprising:
   generating, via a comb laser, a laser signal that includes laser light of a first frequency that is red-shifted from a carrier frequency;
   concurrently transmitting the laser signal via an optical waveguide to four ring resonators, wherein:
     a first ring resonator is initially configured for optical resonance at the first frequency,
     a second ring resonator is initially configured for optical resonance at a second frequency that is blue-shifted from the carrier frequency,
     a third ring resonator is initially configured for optical resonance at the second frequency, and
     a fourth ring resonator is initially configured for optical resonance at the second frequency;
   modulating the laser signal to communicate data to a first target location associated with the first ring resonator; and
   reconfiguring the comb laser to include laser light of the second frequency in the laser signal instead of laser light of the first frequency while the third ring resonator and the fourth ring resonator are being reconfigured for optical resonance at the first frequency; and
   modulating the laser signal to communicate data to a second target location associated with the second ring resonator after reconfiguration of the third ring resonator and the fourth ring resonator for optical resonance at the first frequency is completed.

2. The method of claim 1, further comprising:
   reconfiguring the comb laser to include laser light of the first frequency in the laser signal instead of laser light of the second frequency while the first ring resonator and the fourth ring resonator are being reconfigured for optical resonance at the second frequency; and
   modulating the laser signal to communicate data to a third target location associated with the third ring resonator after reconfiguration of the first ring resonator and the fourth ring resonator for optical resonance at the second frequency is completed.

3. The method of claim 2, further comprising:
   reconfiguring the comb laser to include laser light of the second frequency in the laser signal instead of laser light of the first frequency while the first ring resonator and the second ring resonator are being reconfigured for optical resonance at the first frequency; and
   modulating the laser signal to communicate data to a fourth target location associated with the fourth ring resonator after reconfiguration of the first ring resonator and the second ring resonator for optical resonance at the first frequency is completed.

4. The method of claim 3, further comprising:
   reconfiguring the comb laser to include laser light of the first frequency in the laser signal instead of laser light of the second frequency while the second ring resonator and the third ring resonator are being reconfigured for optical resonance at the second frequency.

5. The method of claim 1, wherein the laser signal includes laser light of N frequencies, wherein N is an integer greater than one, and wherein the method further comprises:
   concurrently transmitting the laser signal via the optical waveguide to a number of ring modulators equal to N multiplied by four; and
   modulating the laser signal to communicate data to N destinations associated with N ring modulators concurrently.

6. A method comprising:
   generating, via a comb laser, a laser signal that includes laser light of a first frequency that is red-shifted from a carrier frequency;
   concurrently transmitting the laser signal via an optical waveguide to four ring resonators, wherein:
     a first ring resonator is initially configured for optical resonance at the first frequency,
     a second ring resonator is initially configured for optical resonance at a second frequency that is blue-shifted from the carrier frequency,
     a third ring resonator is initially configured for optical resonance at the second frequency, and
     a fourth ring resonator is initially configured for optical resonance at the second frequency;
   modulating the laser signal to communicate data to a first target location associated with the first ring resonator;
   wherein the laser signal includes laser light of a first additional frequency that is red-shifted from an additional carrier frequency, and wherein the method further comprises:
   concurrently transmitting the laser signal via the optical waveguide to an additional four ring resonators, wherein:
     a first additional ring resonator is initially configured for optical resonance at the first additional frequency,
     a second additional ring resonator is initially configured for optical resonance at a second additional frequency that is blue-shifted from the additional carrier frequency,
     a third additional ring resonator is initially configured for optical resonance at the second additional frequency, and
     a fourth additional ring resonator is initially configured for optical resonance at the second additional frequency;
   modulating the laser signal to communicate data to a first additional target location associated with the first additional ring resonator; and
   reconfiguring the comb laser to include laser light of the second additional frequency in the laser signal instead of laser light of the first additional frequency while the third additional ring resonator and the fourth additional ring resonator are being reconfigured for optical resonance at the first additional frequency.

\* \* \* \* \*